United States Patent
Lee et al.

(10) Patent No.: US 9,711,159 B2
(45) Date of Patent: *Jul. 18, 2017

(54) APPARATUS AND METHOD FOR ENCODING AND DECODING OF INTEGRATED SPEECH AND AUDIO UTILIZING A BAND EXPANDER WITH A SPECTRAL BAND REPLICATION TO OUTPUT THE AUDIO OR SPEECH TO A FREQUENCY DOMAIN ENCODER OR AN LPC ENCODER

(71) Applicants: ELECTRONICS AND TELECOMMUNICATIONS RESEARCH INSTITUTE, Daejeon (KR); Kwangwoon University Industry-Academic Collaboration Foundation, Seoul (KR)

(72) Inventors: Tae Jin Lee, Daejeon (KR); Seung Kwon Baek, Chungcheongbuk-do (KR); Min Je Kim, Daejeon (KR); Dae Young Jang, Daejeon (KR); Jeongil Seo, Daejeon (KR); Kyeongok Kang, Daejeon (KR); Jin Woo Hong, Daejeon (KR); Hochong Park, Seoul (KR); Young Cheol Park, Seoul (KR)

(73) Assignees: ELECTRONICS AND TELECOMMUNICATIONS RESEARCH INSTITUTE, Daejeon (KR); KWANGWOON UNIVERSITY INDUSTRY-ACADEMIC COLLABORATION FOUNDATION, Seoul (KR)

( * ) Notice: Subject to any disclaimer, the term of this patent is extended or adjusted under 35 U.S.C. 154(b) by 17 days.

This patent is subject to a terminal disclaimer.

(21) Appl. No.: 14/605,006

(22) Filed: Jan. 26, 2015

(65) Prior Publication Data
US 2015/0154974 A1    Jun. 4, 2015

Related U.S. Application Data

(63) Continuation of application No. 13/054,376, filed as application No. PCT/KR2009/003861 on Jul. 14, 2009, now Pat. No. 8,990,072.

(30) Foreign Application Priority Data

Jul. 14, 2008  (KR) .................... 10-2008-0068369
Jul. 22, 2008  (KR) .................... 10-2008-0071218
Jul. 8, 2009   (KR) .................... 10-2009-0062070

(51) Int. Cl.
*G10L 19/00* (2013.01)
*G10L 21/00* (2013.01)
(Continued)

(52) U.S. Cl.
CPC ............ *G10L 19/12* (2013.01); *G10L 19/008* (2013.01); *G10L 19/20* (2013.01); *G10L 19/22* (2013.01); *G11C 2207/16* (2013.01)

(58) Field of Classification Search
CPC .......... G10L 19/20; G10L 19/22; G10L 19/12
(Continued)

(56) References Cited

U.S. PATENT DOCUMENTS 6,134,518 A   10/2000  Cohen et al.
8,990,072 B2 * 3/2015  Lee .................... G10L 19/20
                                                704/201
(Continued)

FOREIGN PATENT DOCUMENTS

JP    11-175098     7/1999
JP    2003-044097   2/2003
(Continued)

OTHER PUBLICATIONS

Shin et al., "Designing a Unified Speech/Audio Codec by Adopting a Single Channel Harmonic Source Separation Module", IEEE, ICASSP, 2008, pp. 185-188.
(Continued)

*Primary Examiner* — Farzad Kazeminezhad
(74) *Attorney, Agent, or Firm* — Staas & Halsey LLP

(57) ABSTRACT

An apparatus and a method for integrally encoding and decoding a speech signal and a audio signal. The encoding apparatus may include: an input signal analyzer to analyze a characteristic of an input signal; a first conversion encoder to convert the input signal to a frequency domain signal, and (Continued)

to encode the input signal when the input signal is a audio characteristic signal; a Linear Predictive Coding (LPC) encoder to perform LPC encoding of the input signal when the input signal is a speech characteristic signal; a frequency band expander with the spectral band replication (SBR) standard for expanding the frequency band of the input signal whose output is transmitted to either the first conversion encoder or the LPC encoder based on the input characteristic; and a bitstream generator to generate a bitstream using an output signal of the first conversion encoder and an output signal of the LPC encoder.

12 Claims, 5 Drawing Sheets

(51) Int. Cl.
G10L 19/12 (2013.01)
G10L 19/008 (2013.01)
G10L 19/20 (2013.01)
G10L 19/22 (2013.01)

(58) Field of Classification Search
USPC .......................................................... 704/201
See application file for complete search history.

(56) References Cited

U.S. PATENT DOCUMENTS

| 2003/0009325 | A1 | 1/2003 | Kirchherr et al. |
| 2007/0271101 | A1 | 11/2007 | Sato et al. |
| 2008/0077412 | A1 | 3/2008 | Oh et al. |
| 2008/0126081 | A1* | 5/2008 | Geiser .................. G10L 21/038 704/201 |
| 2008/0312912 | A1 | 12/2008 | Choo et al. |
| 2015/0332702 | A1* | 11/2015 | Disch .................... G10L 19/22 704/500 |

FOREIGN PATENT DOCUMENTS

| KR | 10-2008-0005325 | 1/2008 |
| WO | 2007/083931 | 7/2007 |
| WO | 2007/083934 | 7/2007 |
| WO | 2008/060114 | 5/2008 |

OTHER PUBLICATIONS

Extended European Search Report issued Sep. 21, 2012 in corresponding European Patent Application No. 09798082.5.
Redwan Salami et al., "Extended AMR-WB for High-Quality Audio on Mobile Devices," Communications Magazine, IEEE vol. 44, Issue 5, May 2006, pp. 90-97.
U.S. Appl. No. 13/054,376, filed Jan. 14, 2011, Tae Jin Lee, Electronics and Telecommunications Research Institute; and Kwangwoon University Industry-Academic Collaboration Foundation.
Office Action mailed Aug. 1, 2012 for U.S. Appl. No. 13/054,376.
Final Office Action mailed Jan. 30, 2013 for U.S. Appl. No. 13/054,376.
Advisory Action issued Apr. 12, 2013 for U.S. Appl. No. 13/054,376.
Notice of Allowance and Fee(s) Due issued Oct. 16, 2015 for U.S. Appl. No. 13/054,376.

* cited by examiner

APPARATUS AND METHOD FOR ENCODING AND DECODING OF INTEGRATED SPEECH AND AUDIO UTILIZING A BAND EXPANDER WITH A SPECTRAL BAND REPLICATION TO OUTPUT THE AUDIO OR SPEECH TO A FREQUENCY DOMAIN ENCODER OR AN LPC ENCODER

CROSS REFERENCE TO RELATED APPLICATIONS

This application is a continuation application of application Ser. No. 13/054,376 filed Jan. 14, 2011 and claims the benefit of International Application No. PCT/KR2009/003861, filed Jul. 14, 2009, and claims the benefit of Korean Application No. 10-2008-0068369, filed Jul. 14, 2008, Korean Application No. 10-2008-0071218, filed Jul. 22, 2008, and Korean Application No. 10-2009-0062070, filed Jul. 8, 2009, the disclosures of all of which are incorporated herein by reference.

TECHNICAL FIELD

The present invention relates to a method and apparatus for integrally encoding and decoding a speech signal and a audio signal. More particularly, the present invention relates to a method and apparatus that may include an encoding module and a decoding module, operating in a different structure with respect to a speech signal and a audio signal, and effectively select an internal module according to a characteristic of an input signal to thereby effectively encode the speech signal and the audio signal.

BACKGROUND ART

Speech signals and audio signals have different characteristics. Therefore, speech codecs for speech signals and audio codecs for audio signals have been independently researched using unique characteristics of the speech signals and the audio signals. A currently widely used speech codec, for example, an Adaptive Multi-Rate Wideband Plus (AMR-WB+) codec has a Code Excitation Linear Prediction (CELP) structure, and may extract and quantize a speech parameter based on a Linear Predictive Coder (LPC) according to a speech model of a speech. A widely used audio codec, for example, a High-Efficiency Advanced Coding version 2 (HE-AAC V2) codec may optimally quantize a frequency coefficient in a psychological acoustic aspect by considering acoustic characteristics of human beings in a frequency domain.

Accordingly, there is a need for a technology that may effectively select an internal module according to a characteristic of an input signal to thereby effectively encode both a speech signal and a audio signal.

DISCLOSURE OF INVENTION

Technical Goals

As described above, according to an embodiment of the present invention, it is possible to provide an excellent sound quality at various bitrates with respect to both a speech signal and a audio signal by effectively selecting an internal module according to a characteristic of an input signal.

According to an embodiment of the present invention, another aspect of the present invention also provides an apparatus and method for integrally encoding and decoding a speech signal and a audio signal that may provide an excellent sound quality with respect to both a speech signal and a audio signal at various bitrates by appropriately combining a speech encoder and a audio encoder.

Technical Solutions

According to an aspect of the present invention, there is provided an encoding apparatus for integrally encoding a speech signal and a audio signal, the encoding apparatus including: an input signal analyzer to analyze a characteristic of an input signal; a first conversion encoder to convert the input signal to a frequency domain signal, and to encode the input signal when the input signal is a audio characteristic signal; a Linear Predictive Coding (LPC) encoder to perform LPC encoding of the input signal when the input signal is a speech characteristic signal; and a bitstream generator to generate a bitstream using an output signal of the first conversion encoder and an output signal of the LPC encoder.

In this instance, the encoding apparatus may further include: a stereo encoder to down-mix the input signal to a mono signal, and to extract stereo sound information; and a frequency band expander to expand the input signal to a high frequency band signal.

Also, the stereo encoder may control a parameter value for stereo encoding according to the characteristic of the input signal. Also, the frequency band expander may selectively apply at least one Spectral Band Replication (SBR) standard according to the characteristic of the input signal.

Also, the encoding apparatus may further include a psychological acoustic unit to control the first conversion encoder using an acoustic characteristic of a human being.

Also, the LPC encoder may include: a time domain encoder to perform time-domain encoding of the input signal when the input signal is the speech characteristic signal; and a second conversion encoder to perform fast Fourier transform (FFT) encoding of the input signal when the input signal is the audio characteristic signal.

Also, the input signal analyzer may classify the input signal into any one of the audio characteristic signal, the speech characteristic signal, and a low energy signal.

Also, the speech characteristic signal may be classified into any one of a steady-harmonic state, a low steady-harmonic state, and a steady-noise state. The audio characteristic signal may be classified into any one of a complex-harmonic state and a complex-noisy state According to another aspect of the present invention, there is provided an encoding apparatus for integrally encoding a speech signal and a audio signal, the encoding apparatus including: an input signal analyzer to analyze a characteristic of an input signal; a stereo encoder to down-mix the input signal to a mono signal, and to extract stereo sound information; a frequency band expander to generate information for expanding the input signal to a high frequency band signal; a first conversion encoder to convert the high frequency band signal to a frequency band, and to encode the high frequency band signal when the input signal is a audio characteristic signal; an LPC encoder to perform LPC encoding of the high frequency band signal when the input signal is a speech characteristic signal; and a bitstream generator to generate a bitstream using the stereo sound information, information for expanding the input signal to the high frequency band signal, an output signal of the first conversion encoder, and an output signal of the LPC encoder.

According to still another aspect of the present invention, there is provided a decoding apparatus for integrally encoding a speech signal and a audio signal, the decoding apparatus including: a bitstream analyzer to analyze an input bitstream signal; a conversion decoder to convert the bitstream signal to a frequency domain signal, and to decode the bitstream signal when the bitstream signal is a audio bitstream signal; an LPC decoder to perform LPC decoding of the bitstream signal when the bitstream signal is a speech bitstream signal; a frequency band synthesizer to synthesize a frequency band of the bitstream signal; and a stereo decoder to decode the bitstream signal to a stereo signal.

Advantageous Effects

According to example embodiments, there are an apparatus and method for integrally encoding and decoding a speech signal and a audio signal that may provide an excellent sound quality with respect to both a speech signal and a audio signal at various bitrates by effectively selecting an internal module according to a characteristic of an input signal.

According to example embodiments, there are an apparatus and method for integrally encoding and decoding a speech signal and a audio signal that may provide an excellent sound quality with respect to both a speech signal and a audio signal at various bitrates by appropriately combining a speech encoder and a audio encoder.

BEST MODE FOR CARRYING OUT THE INVENTION

Figure 1:
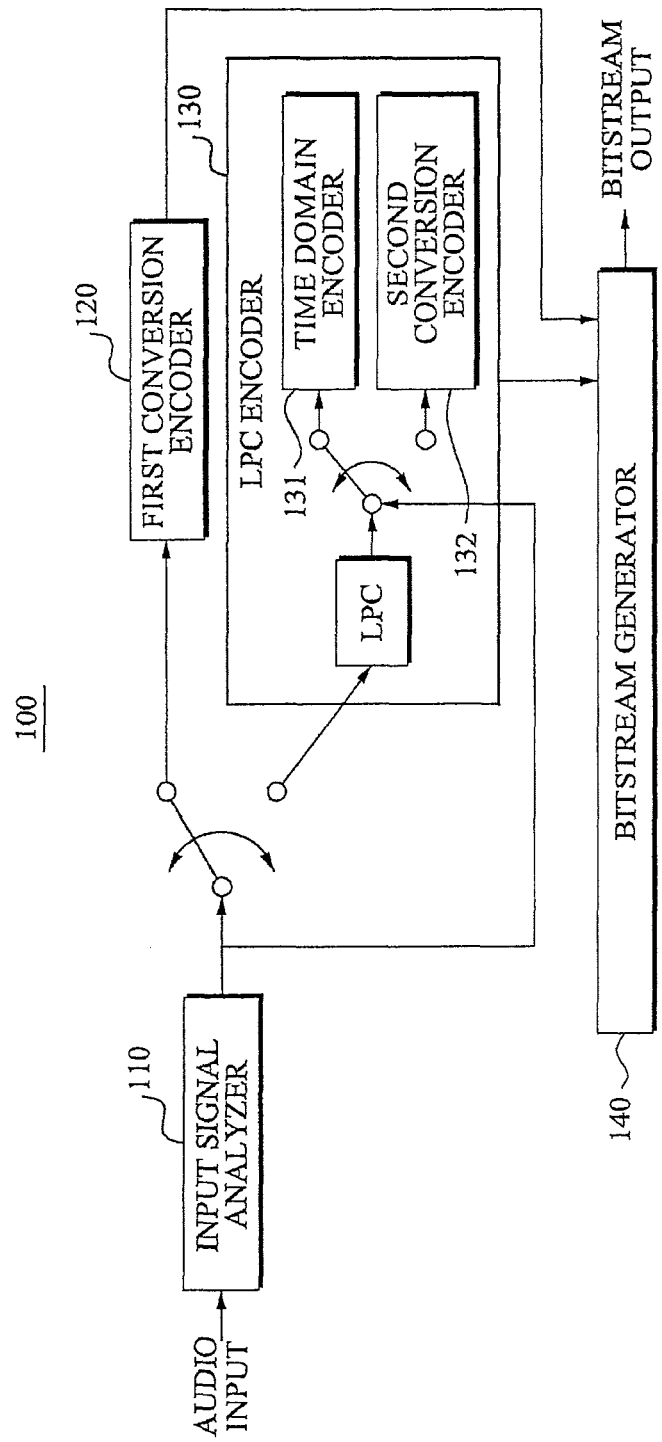
FIG. 1 is a block diagram illustrating an encoding apparatus for integrally encoding a speech signal and a audio signal according to an embodiment of the present invention.

Reference will now be made in detail to embodiments of the present invention, examples of which are illustrated in the accompanying drawings, wherein like reference numerals refer to the like elements throughout. The embodiments are described below in order to explain the present invention by referring to the figures.

FIG. 1 is a block diagram illustrating an encoding apparatus 100 for integrally encoding a speech signal and a audio signal according to an embodiment of the present invention.

Referring to FIG. 1, the encoding apparatus 100 may include an input signal analyzer 110, a first conversion encoder 120, a Linear Predictive Coding (LPC) encoder 130, and a bitstream generator 140.

The input signal analyzer 110 may analyze a characteristic of an input signal. In this instance, the input signal analyzer 110 may analyze the characteristic of the input signal to separate the input signal into any one of a audio characteristic signal, a speech characteristic signal, and a silence state signal.

Here, the speech characteristic signal may be classified into any one of a steady-harmonic state, a low steady-harmonic state, and a steady-noise state. Also, the audio characteristic signal may be classified into any one of a complex-harmonic state and a complex-noisy state.

A state of the input signal may be further classified as follows. Initially, a steady-harmonic (SH) state: The SH state may correspond to a signal interval where a harmonic state of a signal explicitly and stably appears. For example, the signal interval may include a speechd interval. A singleton of sinusoidal signals may be classified into the SH state.

Second, a low steady-harmonic (LSH) state: The LSH state may be similar to the SH state, however, may have a relatively longer harmonic periodicity and show a strong and steady characteristic in a low frequency band. In particular, a speechd interval of a male speech may correspond to the LSH state.

Third, a steady-noise (SN) state: White noise may correspond to the SN state. For example, an unspeechd interval may be included in the SN state.

Fourth, a complex-harmonic (CH) state: A signal interval where a plurality of singleton components is mixed to construct a complex harmonic structure may correspond to the CH state. Generally, play intervals of a audio may be included in the CH state.

Fifth, a complex-noisy (CN) state: A signal containing unstable noise components may be classified into the CN state. For example, ordinary peripheral noise, an attacking signal in a audio play interval, and the like may correspond to the CN state.

Sixth, a silence (Si) state: An interval with a low energy strength may be classified into the Si state.

An output result of the input signal analyzer 110 may be used to select one of the first conversion encoder 120 and the LPC encoder 130. Also, the output result of the input signal analyzer 110 may be used to select one of a time domain encoder 131 and a second conversion encoder 132, when performing LPC encoding.

When the input signal is a audio characteristic signal, the first conversion encoder 120 may convert a core band of the input signal to a frequency domain signal and encode the core band of the input signal. Also, when the input signal is a speech characteristic signal, the LPC encoder 130 may perform LPC encoding of the core band of the input signal. The LPC encoder 130 may include the time domain encoder 131 and the second conversion encoder 132.

When the input signal is the speech characteristic signal, the time domain encoder 131 may perform time-domain encoding of the input signal. When the input signal is the audio characteristic signal, the second conversion encoder 132 perform fast Fourier transform (FFT) encoding of the input signal The bitstream generator 140 may generate a bitstream using information of the first conversion encoder 120 and information of the LPC encoder 130.

The encoding apparatus 100 may further include a stereo encoder (not shown) to down-mix the input signal to a mono signal, and to extract stereo sound information. The stereo encoder may selectively apply at least one parameter according to the characteristic of the input signal.

Also, the encoding apparatus 100 may further include a frequency band expander (not shown) to expand the input signal to a high frequency band signal. The frequency band expander may selectively apply at least one Spectral Band Replication (SBR) standard according to the characteristic of the input signal.

Also, the encoding apparatus 100 may further include a psychological acoustic unit (not shown) to control the first conversion encoder 120 using an acoustic characteristic of a human being.

Figure 2:
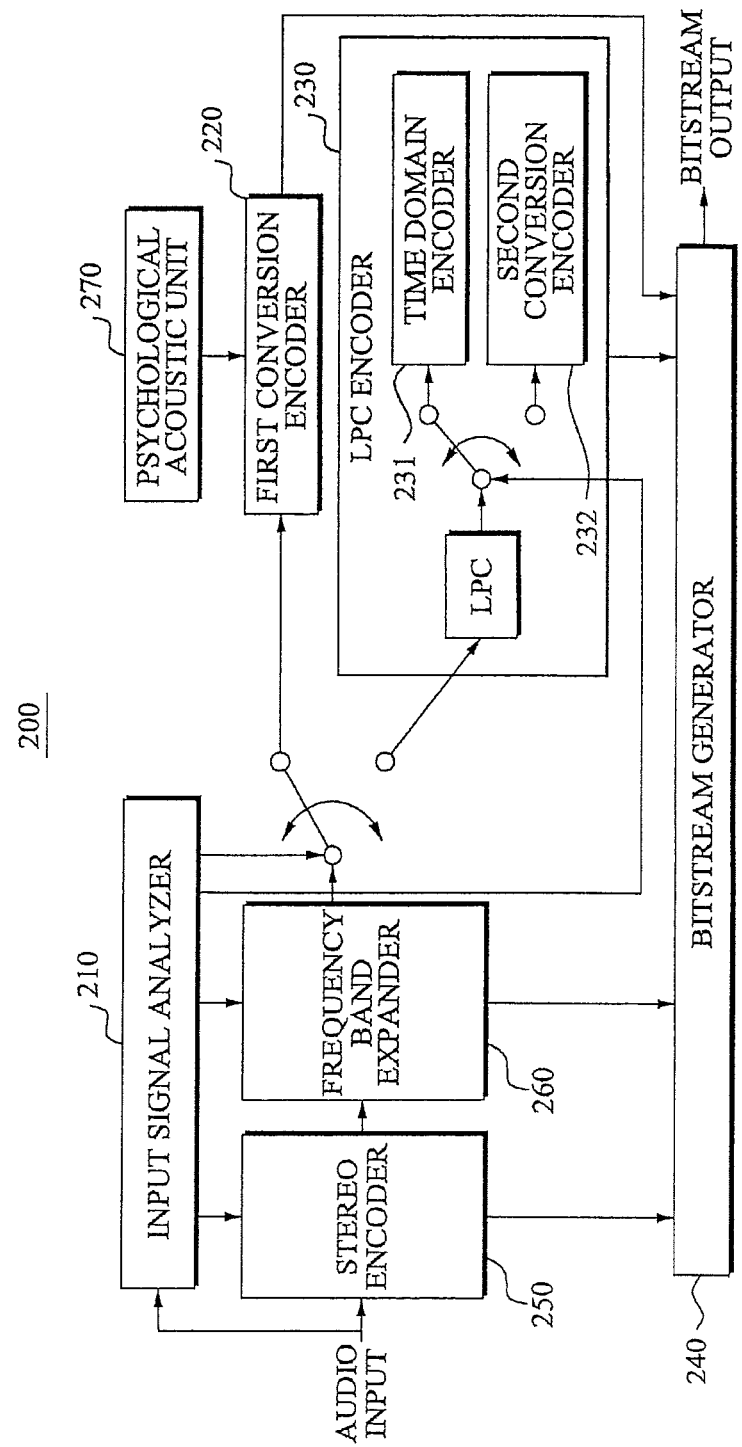
FIG. 2 is a block diagram illustrating an encoding apparatus for integrally encoding a speech signal and a audio signal according to another embodiment of the present invention.

FIG. 2 is a block diagram illustrating an encoding apparatus 200 for integrally encoding a speech signal and a audio signal according to another embodiment of the present invention.

Referring to FIG. 2, the encoding apparatus 200 may include an input signal analyzer 210, a first conversion encoder 220, an LPC encoder 230, a bitstream generator 240, a stereo encoder 250, and a frequency band expander 260.

The input signal analyzer 210 may analyze a characteristic of an input signal.

The stereo encoder 250 may down-mix the input signal to a mono signal, and may extract stereo sound information. For example, when the input signal is a stereo, the stereo encoder 250 may down-mix the input signal to the mono signal, and may extract the stereo sound information. An operation of the stereo encoder 250 will be further described in detail with reference to FIG. 3.

Figure 3:
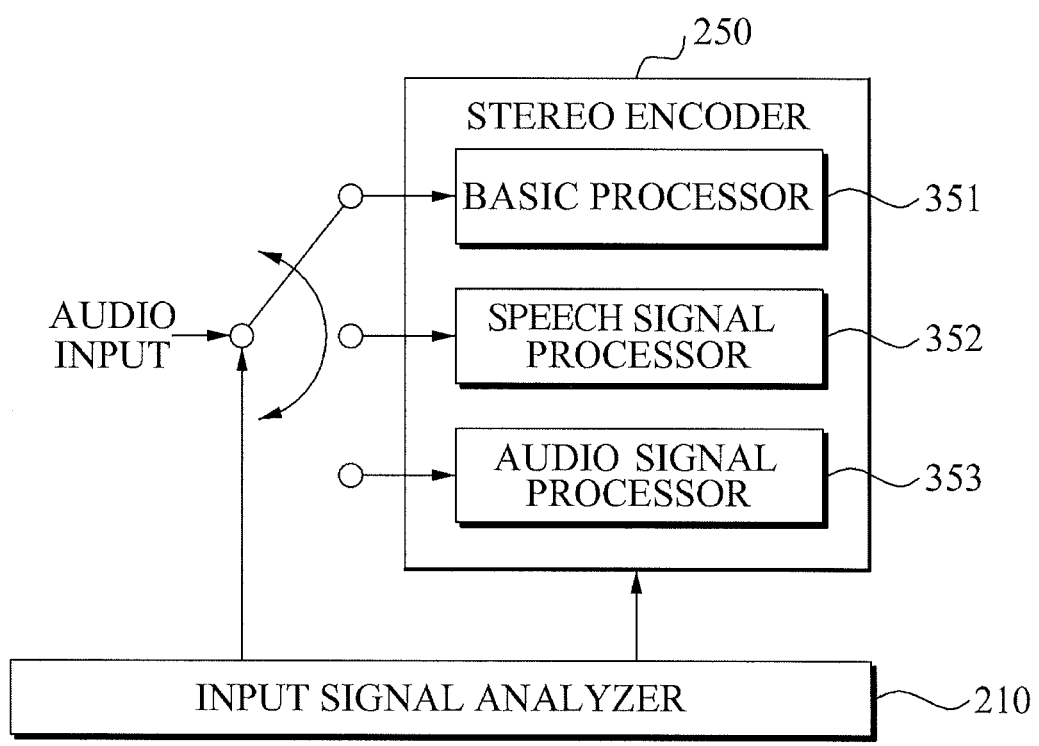
FIG. 3 is a block diagram illustrating an example of a stereo encoder of FIG. 2.

FIG. 3 is a block diagram illustrating an example of the stereo encoder 250 of FIG. 2.

Referring to FIG. 3, the stereo encoder 250 may include a basic processor 351, a speech signal processor 352, and a audio signal processor 353. Here, the stereo encoder 250 may utilize a different encoding module based on the characteristic of the input signal. For example, information of the input signal analyzed by the input signal analyzer 210 may be utilized in the stereo encoder 250. A parameter to be used in the stereo encoder 250 may be adjusted based on the analyzed input signal. For example, when the characteristic of the input signal corresponds to a complex state, the input signal may have a strong audio characteristic. Accordingly, in order to more clearly present a stereo sound, the audio signal processor 353 may transmit a basic parameter used in the stereo encoder 250 at a high resolution, and may also transmit additional information for a stereo sound. For example, when the characteristic of the input signal corresponds to the complex state, the stereo encoder 250 may extend an Inter-Channel Correlation (ICC) parameter to a 16-level parameter using an 8-level quantizer, and thereby transmit the parameter. Through this, it is possible to enhance a characteristic of a stereo sound.

When the characteristic of the input signal corresponds to a steady state, the input signal may be processed by the speech signal processor 352. Other signals may be processed by the basic processor 351.

The frequency band expander 260 may generate information for expanding the input signal to a high frequency band signal. The frequency band expander 260 may selectively apply at least one SBR standard according to the characteristic of the input signal. Hereinafter, the frequency band expander 260 will be further described in detail with reference to FIG. 4.

Figure 4:
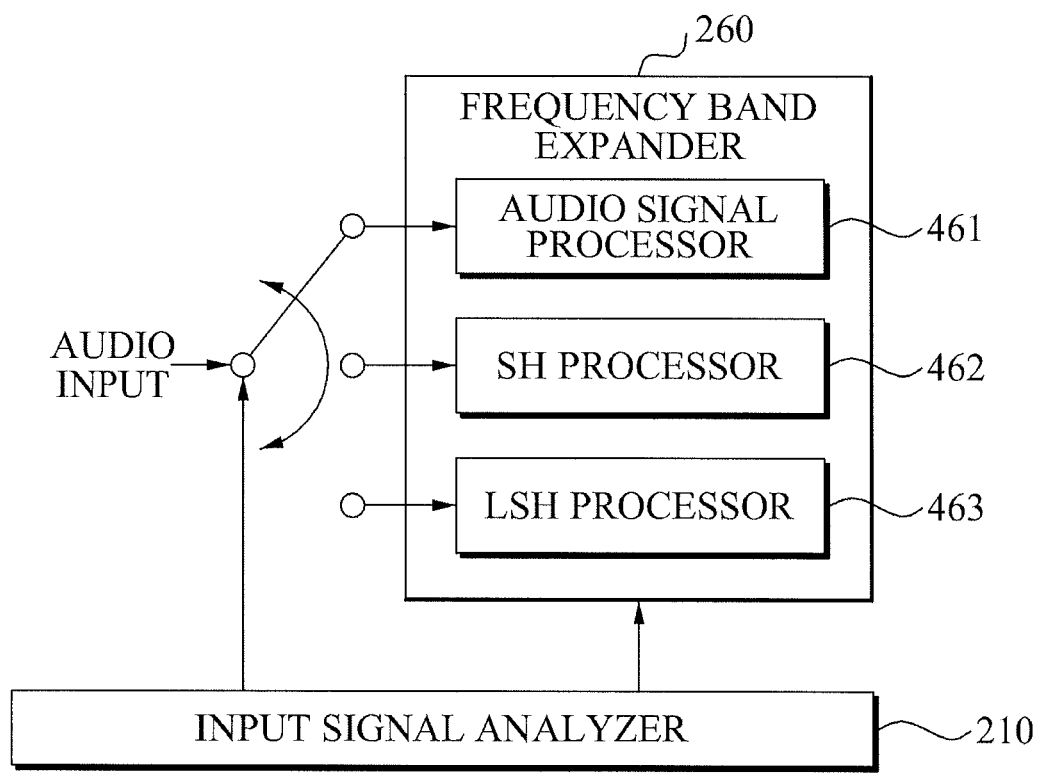
FIG. 4 is a block diagram illustrating an example of a frequency band expander of FIG. 2.

FIG. 4 is a block diagram illustrating an example of the frequency band expander 260 of FIG. 2.

Referring to FIG. 4, the frequency band expander 260 may include an audio signal processor 461, an SH processor 462, and an LSH processor 463. Specifically, information analyzed by the input signal analyzer 210 may be utilized by the frequency band expander 260. When the characteristic of the input signal corresponds to a complex state, the audio signal processor 461 may perform encoding using the same scheme as an existing encoding scheme.

When the characteristic of the input signal corresponds to a complex-noise state, it may indicate that large amounts of information is contained in a high frequency band and thus the audio signal processor 461 may allocate and process relatively large amounts of bits. When the input signal is a speech, most of high frequency band signals may be unvoiced noise signals. Accordingly, in the case of the steady state, an operation of the frequency band expander 260 may be applied to be different from the complex state. Specifically, there is a need to apply a frequency band expansion standard for accurately representing a white noise. In particular, since a harmonic state of a male speech is clearly different from a harmonic state of a female speech, the male speech may be relatively less sensitive to high frequency information in comparison to the female speech. Accordingly, the SH processor 462 may weaken white noise encoding with respect to the male speech and may also set an encoding so that a high frequency domain is not predicted. The LSH processor 463 may encode the input signal to be suitable for a characteristic of the female speech.

When the input signal is the audio characteristic signal, the first conversion encoder 220 may convert the high frequency band signal to a frequency domain signal and thereby encode the high frequency band signal. When the characteristic of the input signal corresponds to the complex state, the first conversion encoder may perform encoding of the core band where a frequency band expansion is not performed. For example, the first conversion encoder 220 may use a Modified Discrete Cosine Transform (MDCT) encoding scheme.

When the input signal is the speech characteristic signal, the LPC encoder 230 may perform LPC encoding of the high frequency band signal. When the characteristic of the input signal corresponds to the steady state, the LPC encoder 230 may perform LPC encoding of the core band where a frequency band expansion is not performed. The LPC encoder 230 may include a time domain encoder 231 and a second conversion encoder 232.

When the input signal is the speech characteristic signal, the time domain encoder 231 may perform time-domain encoding of the input signal. Specifically, depending on whether a harmonic state is steady or low, for example, depending on a steady state result, the time domain encoder 231 may perform time-domain encoding with respect to an LPC processed signal, using a Code Excitation Linear Prediction (CELP) scheme.

When the input signal is the audio characteristic signal, the second conversion encoder 232 may perform FFT encoding of the input signal. Specifically, the second conversion encoder 232 may perform encoding in a frequency domain according to a harmonic state, using an FFT scheme of transforming the input signal to the frequency domain signal. Here, the second conversion encoder 232 may variously construct a resolution based on the characteristic of the input signal.

The bitstream generator 240 may generate a bitstream using the stereo sound information, information for expanding the input signal to the high frequency band signal, information of the first conversion encoder 220, and information of the LPC encoder 230.

The encoding apparatus 200 may further include a psychological acoustic unit 270 to control the first conversion encoder 220 using an acoustic characteristic of a human being.

Figure 5:
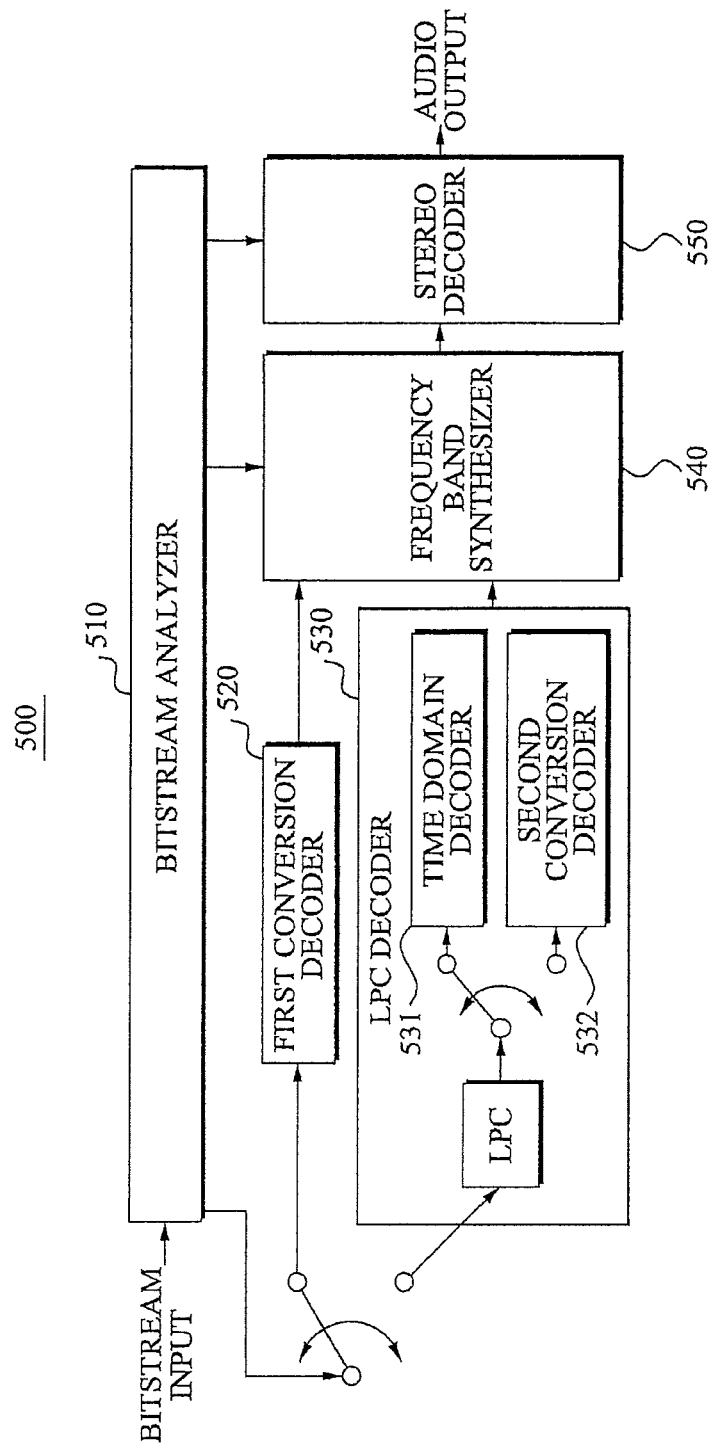
FIG. 5 is a block diagram illustrating a decoding apparatus for integrally decoding a speech signal and a audio signal according to an embodiment of the present invention.

FIG. 5 is a block diagram illustrating a decoding apparatus 500 for integrally decoding a speech signal and a audio signal according to an embodiment of the present invention.

Referring to FIG. 5, the decoding apparatus 500 may include a bitstream analyzer 510, a first conversion decoder 520, an LPC decoder 530, a frequency band synthesizer 540, and a stereo decoder 550.

The bitstream analyzer 510 may analyze an input bitstream signal.

When the bitstream signal is a audio bitstream signal, the first conversion decoder 520 may convert the bitstream signal to a frequency domain signal and decode the bitstream signal.

When the bitstream signal is a speech bitstream signal, the LPC decoder 530 may perform LPC decoding of the bitstream signal. The LPC decoder may include a time domain decoder 531 to decode the input bitstream in a time domain, and a second conversion decoder 532 to decode the input bitstream in a frequency band according to a characteristic of the input bitstream.

The frequency band synthesizer 540 may synthesize a frequency band of the bitstream signal.

The stereo decoder 550 may decode the bitstream signal to a stereo signal.

Specifically, the decoding apparatus 500 may perform an inverse operation of the encoding apparatuses 100 and 200.

As described above, according to an embodiment of the present invention, it is possible to provide an excellent sound quality at various bitrates with respect to both a speech signal and a audio signal by effectively selecting an internal module according to a characteristic of an input signal.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

The invention claimed is:

1. A method for integrally encoding a speech signal and an audio signal, executed by a computer, the method comprising:
    analyzing a characteristic of an input signal whether the input signal is an audio characteristic signal or a speech characteristic signal;
    applying a Spectral Band Replication (SBR) to the input signal;
    generating information for expanding the input signal;
    encoding the input signal applied to the SBR based on the characteristic of the input signal;
    generating a bitstream using an encoding result,
    wherein the encoding of the input signal is performed by one of
    encoding a core band of the input signal using a time-domain encoding module, when the input signal is the speech characteristic signal and
    encoding the core band of the input signal using a transform encoding module, when the input signal is the audio characteristic signal,
    wherein the core band is a frequency band of the input signal which is not expanded in the input signal, and
    wherein an output of the SBR with respect to the input signal is transmitted to the time-domain encoding module or the transform encoding module according to the characteristic of the input signal being the audio characteristic signal or the speech characteristic signal.

2. The method of claim 1, wherein the expanding comprising:
    expanding a frequency band based on Spectral Band Replication (SBR).

3. The method of claim 1, wherein the time-domain encoding module encodes the core band of the input signal based on Linear Predictive Coding (LPC) scheme.

4. The method of claim 1, wherein the transform encoding module encodes the core band of the input signal based on a Modified Discrete Cosine Transform (MDCT) scheme.

5. A decoding method for integrally decoding a speech signal and an audio signal, executed by a computer, the method comprising:
    determining whether a characteristic of an encoded input signal included in a bitstream is an audio characteristic signal or a speech characteristic signal;
    decoding the encoded input signal based on the characteristic of the encoded input signal; and
    wherein the decoding of the input signal is performed by one of decoding a core band of the input signal based on a time-domain decoding module, when the encoded input signal is the speech characteristic signal, and
    decoding the core band of the input signal based on a transform decoding module, when the encoded input signal is the audio characteristic signal,
    wherein the core band is a frequency band of the encoded input signal which is not to be expanded, and
    wherein the encoded input signal is transmitted to the time-domain decoding module or the transform decoding module according to the characteristic of the encoded input signal being the audio characteristic signal or the speech characteristic signal.

6. The method of claim 5, wherein the time-domain decoding module decodes the core band of the input signal based on Linear Predictive Coding (LPC) scheme.

7. The method of claim 5, wherein the transform decoding module decodes the core band of the input signal based on a Modified Discrete Cosine Transform (MDCT) scheme.

8. A decoding apparatus for integrally decoding a speech signal and an audio signal, executed by a computer, the apparatus comprising a processor:
    wherein the processor configured to:
    determine whether a characteristic of an encoded input signal included in a bitstream is an audio characteristic signal or a speech characteristic signal;
    decode the encoded input signal based on the characteristic of the encoded input signal,
    wherein the decoding of the input signal is performed by one of decoding a core band of the input signal based on a time-domain decoding module,
    when the encoded input signal is the speech characteristic signal and
    decoding the core band of the input signal based on a transform decoding module,
    when the encoded input signal is the audio characteristic signal, and
    wherein the core band is a frequency band of the encoded input signal which is not to be expanded, and
    wherein the encoded input signal is transmitted to the time-domain decoding module or the transform decoding module according to the characteristic of the encoded input signal being the audio characteristic signal or the speech characteristic signal.

9. A decoding method for integrally decoding a speech signal and an audio signal, executed by a computer, the method comprising:

determining whether a characteristic of an encoded input signal included in a bitstream is an audio characteristic signal or a speech characteristic signal; and decoding the encoded input signal based on the characteristic of the encoded input signal, wherein the decoding of the input signal is performed by one of decoding a core band of the input signal based on a time-domain decoding module, when the encoded input signal is the speech characteristic signal, and decoding the core band of the input signal based on a transform decoding module, when the encoded input signal is the audio characteristic signal, and wherein the core band is a frequency band of the encoded input signal which is not to be expanded, and wherein the encoded input signal is transmitted to the time-domain decoding module or the transform decoding module according to the characteristic of the encoded input signal being the audio characteristic signal or the speech characteristic signal.

10. The method of claim 9, wherein the time-domain decoding module decodes the core band of the input signal based on Linear Predictive Coding (LPC) scheme.

11. The method of claim 9, wherein the transform decoding module decodes the core band of the input signal based on a Modified Discrete Cosine Transform (MDCT) scheme.

12. A decoding apparatus for integrally decoding a speech signal and an audio signal, executed by a computer, the apparatus comprising a processor:

wherein the processor configured to:

determine whether a characteristic of an encoded input signal included in a bitstream is an audio characteristic signal or a speech characteristic signal;

decode the encoded input signal based on the characteristic of the encoded input signal, wherein the decoding of the input signal is performed by one of decoding a core band of the input signal based on a time-domain decoding module, when the encoded input signal is the speech characteristic signal and decoding the core band of the input signal based on a transform decoding module, when the encoded input signal is the audio characteristic signal, and wherein the code band is a frequency band of the encoded input signal which is not be expanded, wherein the encoded input signal is transmitted to the time-domain decoding module or the transform decoding module according to the characteristic of the encoded input signal being the audio characteristic signal or the speech characteristic signal.

* * * * *